United States Patent [19]
Ochii et al.

[11] 4,379,346
[45] Apr. 5, 1983

[54] SEMICONDUCTOR MEMORY DEVICE
[75] Inventors: Kiyofumi Ochii, Yokohama; Masami Masuda, Tokyo; Takeo Kondo, Yokosuka, all of Japan
[73] Assignee: Tokyo Shibaura Denki Kabushiki Kaisha, Kawasaki, Japan
[21] Appl. No.: 170,687
[22] Filed: Jul. 21, 1980
[30] Foreign Application Priority Data
   Jul. 26, 1979 [JP] Japan .................. 54/95526
[51] Int. Cl.³ ............................. G11L 13/00
[52] U.S. Cl. .................... 365/222; 365/149
[58] Field of Search .................. 365/222, 149
[56] References Cited
U.S. PATENT DOCUMENTS
   3,644,905  2/1972  Baker .................. 365/149
   4,069,475  1/1978  Boettcher .................. 365/149
   4,168,536  9/1979  Joshi et al. .................. 365/149

Primary Examiner—Terrell W. Fears
Attorney, Agent, or Firm—Finnegaan, Henderson, Farabow, Garrett & Dunner

[57] ABSTRACT

A semiconductor memory device includes a plurality of memory cells arranged in a matrix fashion, word lines each connected commonly to the memory cells arranged on the same row, plural pairs of data lines each pair connected commonly to the memory cells on the same column line, and a row decoder connected to the word lines. The semiconductor memory device further includes positive feedback amplifiers connected to the work lines, which respond to voltages on the word lines at a preset or higher level to pull up the potential on the word lines to a higher level.

38 Claims, 12 Drawing Figures

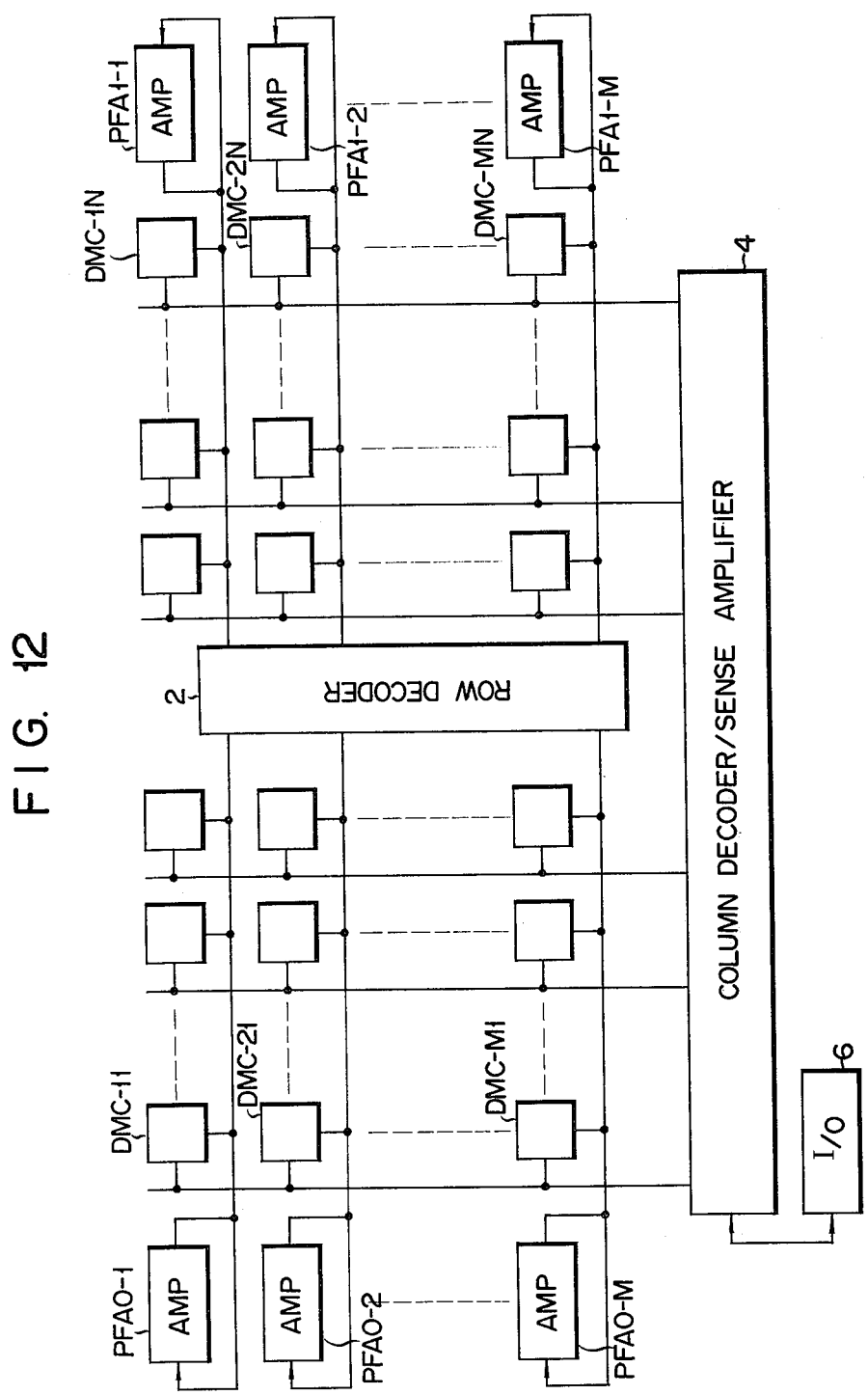

SEMICONDUCTOR MEMORY DEVICE

The present invention relates to a semiconductor memory device.

Generally, the semiconductor memory device is provided with memories formed of insulated gate field effect transistors (MOS FET). The semiconductor memory device is generally categorised into one of two types, a dynamic memory device and a static memory device, from a view point of its operation. The dynamic memory device is suitable for a high density of integrated circuit fabrication while the static memory device is suitable for a high speed memory device because of less restriction on the timing condition for its operation. From a viewpoint of the semiconductor manufacturing technology, the MOS memory is classified into a metal gate MOS memory formed of metal gate MOS transistors using metal gate electrodes with extremely small sheet resistance, and a silicon gate MOS memory formed of silicon gate MOS FETs having gate made of polysilicon with higher sheet resistance than that of the metal. The metal gate MOS memory does not use the polysilicon layer. For this reason, it requires fewer steps to manufacture. However, it needs a relatively large area for wiring. On the other hand, the silicon gate MOS memory requires an additional step to form the polysilicon layer, resulting in a more complex manufacturing process. Nevertheless, in addition to the polysilicon layer, a metal layer may be used independently of the polysilicon layer. As a result, the area required for wiring is reduced. This makes it possible to dispose memory elements at a high density.

A recent demand for memories with large storage capacity has stimulated the use of silicon gate MOS memory, which is well adaptable for the memory device having memory elements disposed at a high density and a large storage capacity. Metal gate MOS memory is used only for constructing a memory which is inexpensive and has a small storage capacity.

FIG. 1 shows a semiconductor memory device formed of silicon gate MOS memories of this type. The semiconductor memory device includes a plurality of MOS memory cells MC-11 to MC-MN arranged in a matrix fashion, paired data lines Do-1 and D1-1, D0-2 and D1-2, . . . , and D0-N and D1-N which are commonly connected to input and output terminals of the memory cells on the same column, respectively, and word lines W1 to WM each for transferring an address signal to access specified memory cells on the same row. The word lines W1 to WM are connected to a row decoder 2 which receives a row address from an address signal generator (not shown) to selectively energize the word lines. The data lines D0-1 to D0-N and D1-1 to D1-N are connected to a column decoder/sense amplifier 4 which responds to a column designating signal from the address signal generator to selectively energize the data lines and supply the data read out from a desired memory cell to a data processor (not shown), by way of an I/O unit 6.

In this type silicon gate MOS memory, it is a common practice that in order to obtain effective wiring, the word lines W1 to WM directly connected to the access gating sections of the memory cells are formed of polysilicon layers while the data lines D0-1 to D0-N and D1-0 to D1-N are formed of metal layers.

With the semiconductor memory device thus constructed as shown in FIG. 1, to execute a read operation mode, the row decoder 2 and the column decoder 4 respond to an address signal from an address signal generator (not shown) to selectively energize one of the word lines W1 to WM and one of pairs of the data lines D0-1 to D0-N and D1-1 to D1-N. Upon energization, the memory cells coupled with the word lines energized correspondingly produce the stored data. Of those data, only the data transferred to the pair of data lines selected by the column decoder/sense amplifier 4 is amplified by the sense amplifier 4 and then is transmitted to an I/O unit 6.

The data read time from the instant that the row and column address signals are supplied to the row decoder 2 and the column decoder 4, respectively, until the instant that the data read out of a desired memory cell is transferred to the I/O unit 6, depends on the setup time of the row decoder 2, the transfer time of the row address signal on the word line, the transfer time of the data on the data line, and the transfer time of the data from the sense amplifier 4 to the I/O unit 6. It should be noted here that the transfer time of the row address signal on the word line generally has the greatest influence upon the data read time, since the word line is formed of the polysilicon layer with a high sheet resistance, as previously stated. As a consequence, in constructing a high speed memory device, it is essential to minimize particularly the transfer time of the row address signal on the word line thereby to reduce the over-all operation delay time. To this end, the following measures have been employed:

(i) The gate layer is made of material which provide a small resistance of the word line per se and a small stray capacitance associated with the word line. This measure is based on the fact that the signal transfer time on the word line depends largely on the resistance of the word line and the stray capacitance of the same.

(ii) The polysilicon layer is formed so as to substantially reduce the resistance of the word line itself. For example, the width of the polysilicon layer is made large. Another way is to dispose the row decoder 2 at the central portion of the memory cell array as shown in FIG. 2 whereby the word lines W1 to WM are each divided into two half-sections thereby to reduce the effective resistance and capacitance of the word line by one half.

(iii) The sensitivity of the sense amplifier is increased to sense data read out onto the data lines D0-1 to D0-N and D1-1 to D1-N with a high sensitivity so that the sensed data can be transferred to the I/O unit 6 at a high speed.

Those measures have successfully reduced the read operation delay to some extent. However, because of the recent demand for an increase in memory speed, it is further required to reduce the time delay in the readout operation.

Accordingly, an object of this invention is to provide a semiconductor device which shortens the access time of memory cells.

According to one aspect of the present invention, there is provided a semiconductor memory device comprising: at least one memory cell; at least one word line coupled with the memory cell; at least one data line coupled with the memory cell to transfer data with respect to the memory cell; and a positive feedback amplifying means coupled with the word line which amplifies an access signal supplied to the word line and positively feeds back to the word line.

The present invention will be better understood from the following description taken in connection with the accompanying drawings, in which:

FIG. 12 is an arrangement of a semiconductor memory device constructed by using a plurality of memory cells with a similar construction to that of the memory cell shown in FIG. 11.

The present invention is based on the fact that a resistance of a word line and a stray capacitance associated with the word line are substantially uniformly distributed in a constant manner and therefore an access time to a memory cell coupled with the word line at the farthest location from a row decoder is longest. From this fact, it is deduced that in order to reduce the access time for all the memory cells, it is effective to amplify the access signal on the word line at the farthest location from the row decoder and to positively feed back the amplified access signal to the word line.

Figure 3:
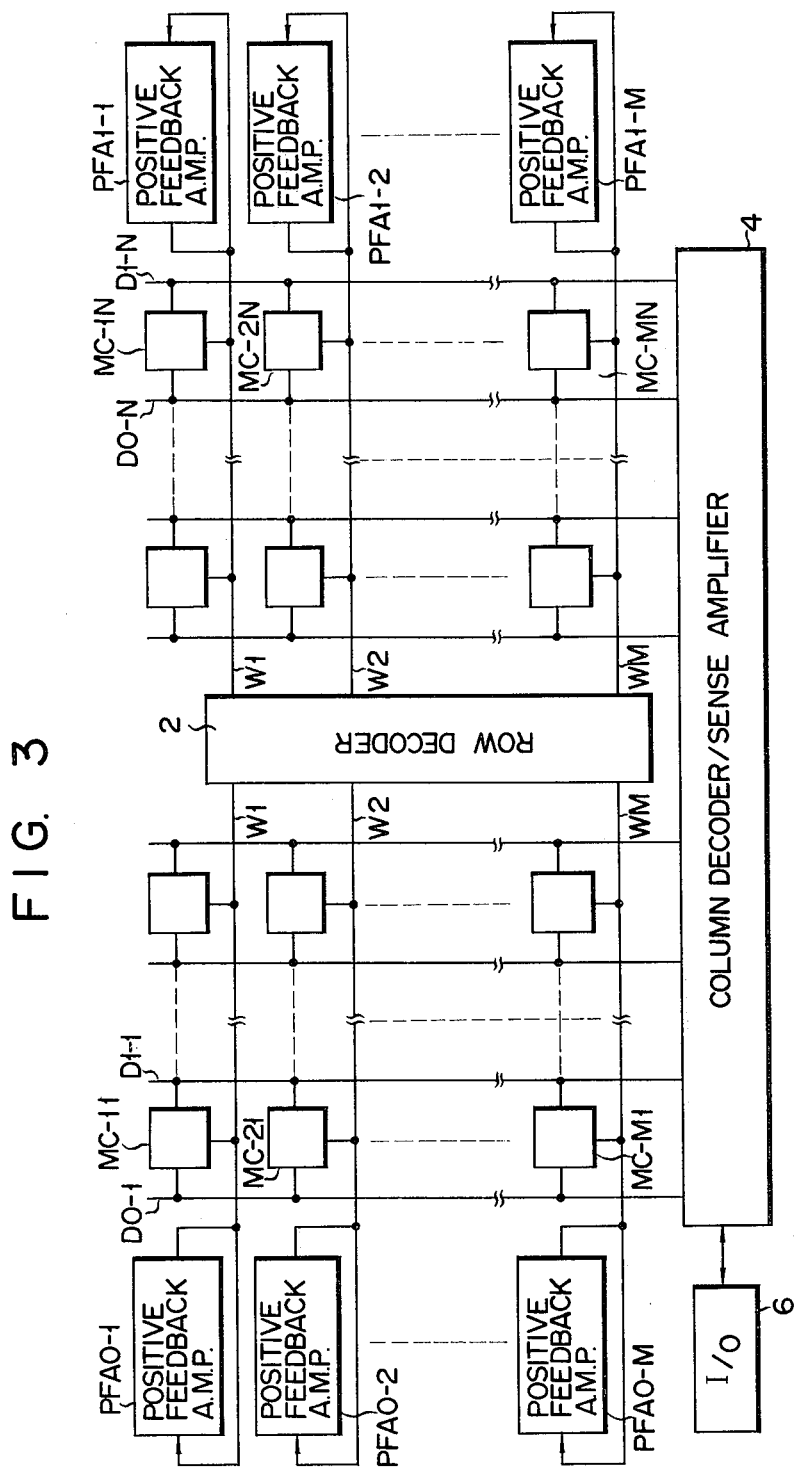
FIG. 3 is a block diagram of an embodiment of a semiconductor memory device according to the present invention.

FIG. 3 is an embodiment of a semiconductor memory according to the technical idea of the invention based on the above fact.

Figure 4:
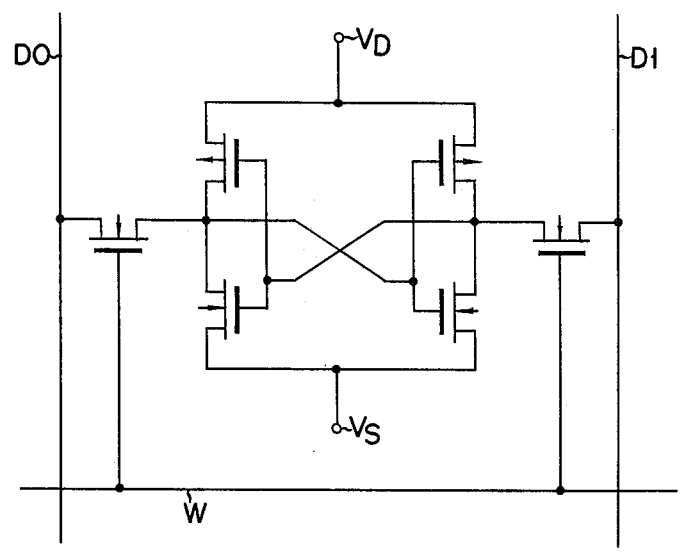
FIGS. 4 and 5 are examples of MOS memory cells which can be used in the semiconductor memory device shown in FIG. 3.
Figure 5:
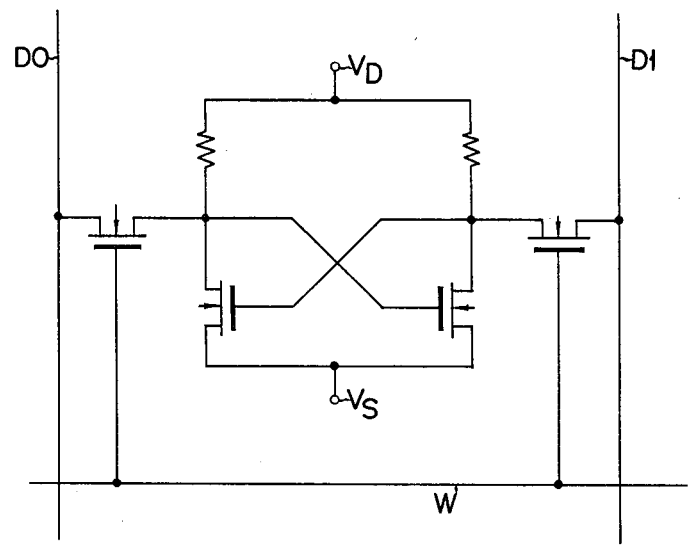

The semiconductor memory device of the invention has a matrix arrangement like the conventional memory device of this type. The memory device of the invention has a plurality of MOS memory cells MC-11 to MC-MN, such as cross coupled memory cells or N channel MOS resistive type memory cells, as respectively shown in FIGS. 4 and 5, paired data lines D0-1 and D0-1, ..., and D0-N and D1-N which are respectively connected commonly to the input/output terminals of the memory cells disposed on the same column, and word lines W1 to WM for transferring an address signal to access memory cells on the same row. The word lines W1 to WM are commonly connected to a row decoder 2 disposed substantially at the central portion of the memory array, which receives a row address from an address signal generator (not shown) to selectively energize, the word lines. The data lines D0-1 to D0-N and D1-1 to D1-N are connected to a column decoder/sense amplifier 4 which responds to a column designating signal from the address signal generator through an I/O unit 6 to selectively energize the data lines and to transfer the data read out from a designated memory cell to a data processor (not shown) through the I/O unit 6. The word lines W1 to WM are connected at both ends to positive feedback amplifiers PFA0-1 to PFA0-M and PFA1-1 to PFA1-M, respectively. These positive feedback amplifiers each have a construction as shown in FIG. 6.

Figure 6:
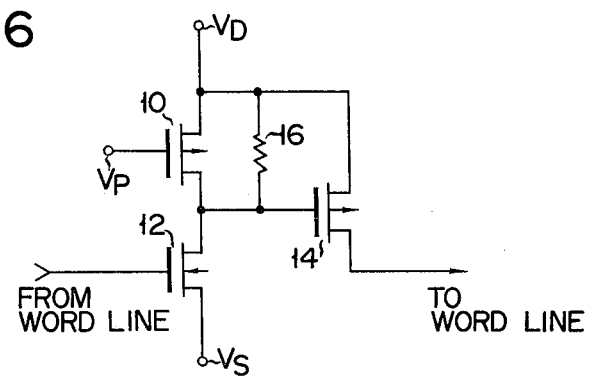
FIG. 6 is a circuit diagram of a positive feedback amplifier circuit which can be used for the semiconductor memory device shown in FIG. 3.

The positive feedback amplifier shown in FIG. 6 has a p-channel MOS FET 10 having a source connected to a positive power source terminal $V_D$, an n-channel MOS FET 12 having a source connected to a reference power source terminal Vs and a drain connected to the drain of the p-channel MOS FET 10, and a p-channel MOS FET 14 having a gate connected to the drains of the FETs 10 and 12 and a source connected to the positive power source terminal $V_D$. Further, a resistor 16 is connected in parallel with a current path of the MOS FET 10. The gate of the MOS FET 10 is coupled with a clock pulse receiving terminal Vp for receiving a low level clock pulse for a given period of time each time the memory operating cycle changes. The gate of the MOS FET 12 and the drain of the MOS FET 14 are connected to the same word line.

There will now be described the operation of the positive feedback amplifier shown in FIG. 6.

In response to clock pulses supplied to the clock receiving terminal Vp, MOS FET 10 is made conductive every memory cycle, that is, every time the address signal is changed, for a given period of time, thereby to precharge the drain of the MOS FET 12 to a high level. For example, when an access signal is applied to the word line and the potential on the word line exceeds the threshold voltage of the MOS FET 12, the MOS FET 12 conducts, so that the drain voltage of the MOS FET 12 decreases toward a reference voltage. When the drain voltage of the MOS FET 12 reaches the threshold voltage of the MOS FET 14, the potential level of the word line is pulled up to a high level by the conduction of the MOS FET 14.

Figure 7:
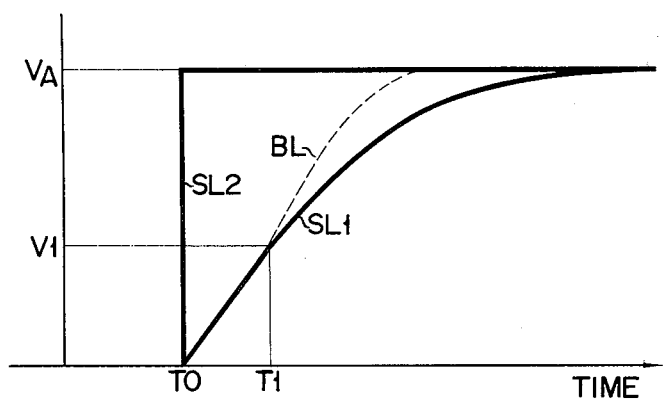
FIG. 7 is a graphical representation of a potential variation, at the time of access, on the word line of the semiconductor memory device according to the present invention and the conventional memory device of this type.

FIG. 7 illustrates a variation of a voltage level of an access signal with a voltage level $V_A$ on the word line when the access signal is produced on the word line at time To.

In FIG. 7, a solid line SL1 shows a voltage variation of the access signal on the portion of the word line at the farthest distance from the decoder 2 when the positive feedback amplifier is not used. Another solid line SL2 illustrates a voltage variation of the access signal on the portion of the word line near the decoder 2.

Figure 8:
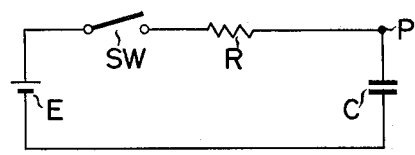
FIG. 8 is an equivalent circuit useful in explaining the potential variation characteristic shown in FIG. 7.

FIG. 8 shows an equivalent circuit of a word line segment ranging from the decoder 2 to the positive feedback amplifier. In the circuit, a battery E produces an output voltage $V_A$, and a resistor R and a capacitor C express the resistance and the stray capacitance of the word line segment in a clamped constant manner. When a switch SW in the circuit is closed at time To, a potential at a junction P between the resistor R and the capacitor C changes as indicated by the solid line SL1 in FIG. 7. A potential Vx of the access signal on the word line at time T, which is depicted by the line SL1, is mathematically given by the following equation:

$$Vx = V_A \{1 - 3^{-(T-To)/CR}\}$$

At time T1, when the voltage on the word line reaches the voltage level V1, the MOS FET 12 of the positive feedback amplifier shown in FIG. 6 is conductive and the MOS FET 14 also conducts. As a result, the voltage $V_D$ is superposed to the voltage Vx on the word line, through the MOS FET 14, and the potential at the corresponding portion of the word line steeply rises as indicated by a broken line BL in FIG. 7.

As described above, the positive feedback amplifier is coupled with the word line at a distance from the row decoder 2, whereby the voltage rise on the word line, due to the access signal, is made steep, and the access time to the memory cell located near the positive feedback amplifier is remarkably reduced.

Figure 9:
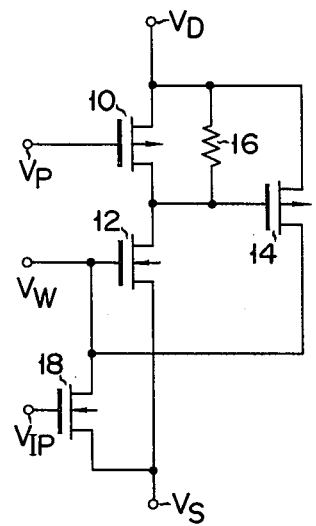
FIG. 9 shows a circuit diagram of a modification of the positive feedback amplifier circuit shown in FIG. 6.

FIG. 9 shows a modification of the positive feedback amplifier circuit shown in FIG. 6. The circuit is the same as that shown in FIG. 6 except that it has additionally an n-channel MOS FET 18 which has a drain coupled with a word line connecting terminal Vw connected to the word line, a source connected to the reference power source terminal Vs, and a gate connected to the clock pulse receiving terminal $V_{IP}$ for receiving clock pulses which are opposite in phase to the pulses applied to the gate of the MOS FET 10.

When the positive feedback amplifier circuit shown in FIG. 6 is used, the potential on the word line selected changes from high level to low as the row address designation period terminates. At a distance from the decoder 2, the potential change on the word line is slow. When the positive feedback amplifier circuit shown in FIG. 9 is used, a high level signal is applied to the clock pulse receiving terminal $V_{IP}$ as the low address designating period terminates, to render the MOS FET 18 conductive and to instantaneously reduce to the low level the potential at the word line connecting terminal Vw, that is, the potential on the portion of the word line coupled with the positive feedback amplifier. Thus, the use of the positive feedback amplifier circuit shown in FIG. 9 provides for a rapid potential change on the word line.

Figure 10:
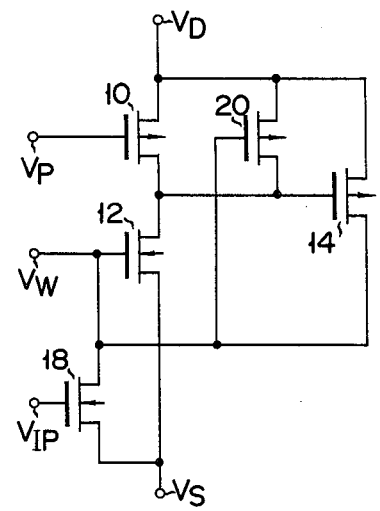
FIG. 10 is a circuit diagram of a modification of the positive feedback circuit shown in FIG. 9.

FIG. 10 shows a modification of the positive feedback amplifier circuit shown in FIG. 9. The circuit in FIG. 10 is similar to that of FIG. 9 except that a p-channel MOS FET 20 is used in place of the resistor 16. The source of the MOS FET 20 is coupled with the power source terminal $V_D$, the drain is connected to the gate of the MOS FET 14, and the gate is connected to the word line connecting terminal Vw.

In the circuit of FIG. 10, when a high level signal is applied to the word line connecting terminal Vw, the MOS FET 20 is rendered nonconductive to block the current flow from the power source terminal $V_D$ to the reference power source terminal Vs. In the circuit shown in FIG. 9, when a high level signal is applied to the word line connecting terminal Vw, a current flows from the power source terminal $V_D$ to the reference power source terminal Vs through the resistor 16 and the MOS FET 12 conducted. In this respect, the FIG. 10 circuit is superior to the FIG. 9 one.

Having described specific embodiments for practicing the present invention it will be clear to one skilled in the art that such embodiments may be changed and modified variously within the scope of the present invention.

Figure 11:
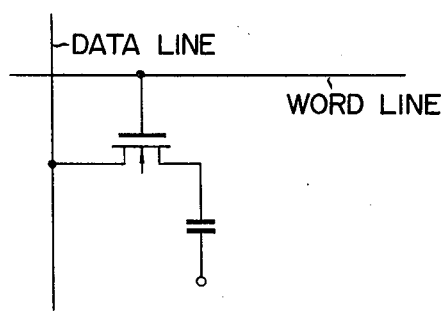
FIG. 11 shows another type of memory cell which can be used for the memory device according to the present invention.

For example, although pairs of word lines are used for the memory-cells on each column the paired data lines may be substituted by a single data line if the dynamic memory cells as shown in FIG. 11 are used. FIG. 12 shows a matrix memory array having memory cells DMC-11 to DMC-MN each with a similar construction to that of the memory cell shown in FIG. 11. The FIG. 12 embodiment also has the useful effect like the FIG. 3 embodiment.

The positive feedback amplifier circuits, which are connected to both ends of the word lines in FIG. 3, may be connected to the word lines at the portion thereof far from the row decoder 2.

Figure 1:
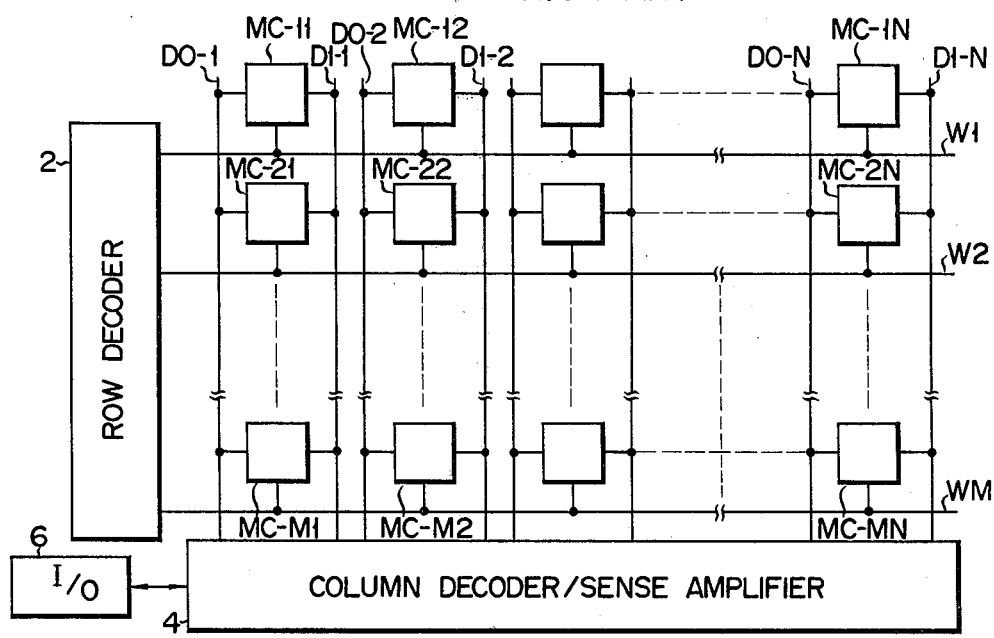
FIGS. 1 and 2 show arrangements of conventional semiconductor memory devices.
Figure 2:
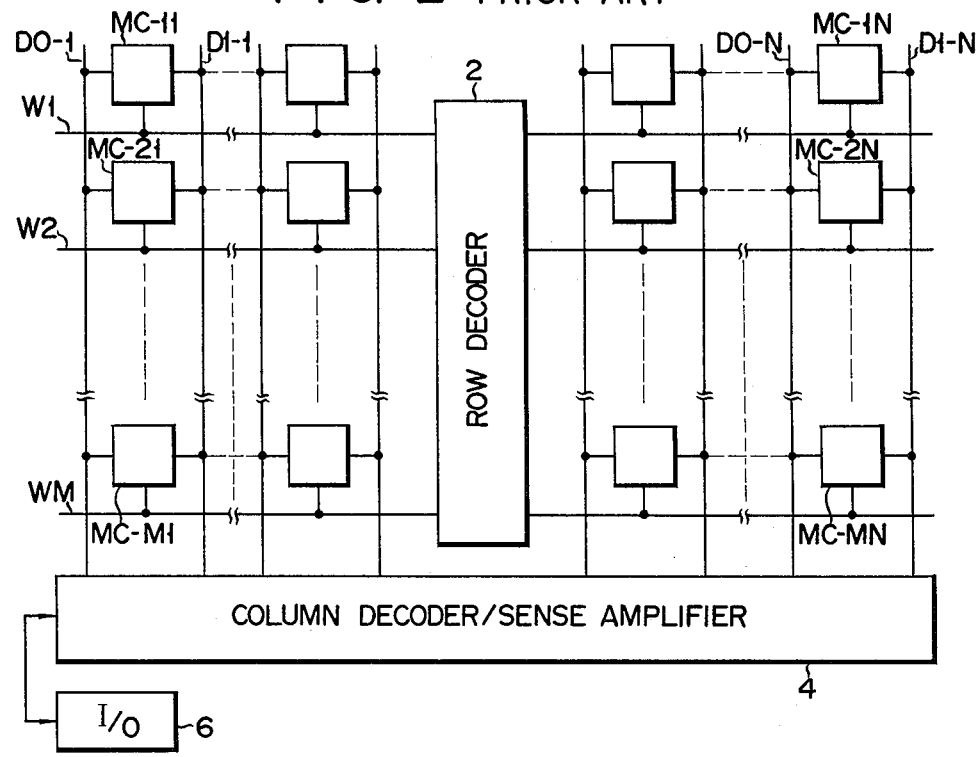

The decoder 2, which is disposed at the substantially central portion of the memory array in the embodiment shown in FIG. 3, may be disposed at any other suitable location. In an extreme example, it may be connected to one end of the word lines, as shown in FIG. 1. In this case, the positive feedback circuit is connected to the other side of the word lines or near the same.

What we claim is:

1. A semiconductor memory device for use with a row decoder supplying row access signals and a column decoder for supplying column access signals, the device comprising:
   at least one memory cell;
   at least one word line connected to said at least one memory cell and receiving the row access signals;
   at least one data line connected to said at least one memory cell to transfer data to and from said at least one memory cell in accordance with said column access signals; and
   positive feedback amplifier means coupled with said at least one word line to amplify said received row access signals supplied to said at least one word line and to positively feed back to said at least one word line said amplified row access signals.

2. A semiconductor memory device according to claim 1, wherein said positive feedback amplifier means is comprised of at least one positive feedback amplifier circuit having first and second power source terminals, first and second MOS transistors of which the current paths are connected in series between said first and second power source terminals, said second MOS transistor being connected at the gate to said word line, a third MOS transistor of which the current path is connected between said first power source terminal and said word line and the gate is connected to a junction between said first and second MOS transistors, and resistive means connected between said first power source terminal and the gate of said third MOS transistor.

3. A semiconductor memory device according to claim 2, wherein said first and third MOS transistors are p-channel MOS transistors and said second MOS transistor is an n-channel MOS transistor.

4. A semiconductor memory device according to claim 2 or 3, wherein said positive feedback amplifier circuit further includes a fourth MOS transistor of which the current path is connected between said word line and said second power source terminal.

5. A semiconductor memory device according to claim 4, wherein said resistive means is a fifth MOS transistor which has a current path connected between said first power source terminal and the gate of said third MOS transistor, and a gate connected to said word line.

6. A semiconductor memory device according to claim 2 or 3, wherein said resistive means is a fifth MOS transistor which has a current path connected between said first power source terminal and the gate of said third MOS transistor and a gate connected to said word line.

7. A semiconductor memory device for use with a row decoder supplying row access signals and a column decoder for supplying column access signals, the device comprising:

At least one word line receiving at one end the row access signals and for transmitting the received row access signal therealong, the row access signals being attenuated during transmission from said one end to the other end of said word line;

a plurality of memory cells connected to said at least one word line;

a plurality of data lines connected to said memory cells to transfer data to and from said memory cells in accordance with the column access signals; and positive feedback amplifier means connected proximate to said other end of said word line to amplify said row access signals transmitted to said other end of said word line and to feed back said amplified access signals to said other end of said word line.

8. A semiconductor memory device according to claim 7, wherein said positive feedback amplifier means is comprised of at least one positive feedback amplifier circuit having first and second power source terminals, first and second MOS transistors of which the current paths are connected in series between said first and second power source terminals, said second MOS transistor being connected at the gate to said word line, a third MOS transistor of which the current path is connected between said first power source terminal and said word line and the gate is connected to a junction between said first and second MOS transistors, resistive means connected between said first power source terminal and the gate of said third MOS transistor.

9. A semiconductor memory device according to claim 8, wherein said first and third MOS transistors are p-channel MOS transistors and said second MOS transistor is an n-channel MOS transistor.

10. A semiconductor memory device according to claim 8 or 9, wherein said positive feedback amplifier circuit further includes a fourth MOS transistor of which the current path is connected between said word line and said second power source terminal.

11. A semiconductor memory device according to claim 10, wherein said resistive means is a fifth MOS transistor which has a current path connected between said first power source terminal and the gate of said third MOS transistor, and a gate connected to said word line.

12. A semiconductor memory device according to claim 8 or 9, wherein said resistive means is a fifth MOS transistor which has a current path connected between said first power source terminal and the gate of said third MOS transistor and a gate connected to said word line.

13. A semiconductor memory device according to claim 7, further comprising a row decoder circuit connected to said one end of said word line to selectively supply the row access signals to said word line.

14. A semiconductor memory device according to claim 7 or 13, wherein said positive feedback amplifying means is coupled to said other end of said word line.

15. A semiconductor memory device for use with a row decoder supplying a row access signal and a column decoder supplying a column access signal, the device comprising:

at least one word line receiving at one end the row access signal and for transmitting the received row access signal there along to the other end of the word line;

a plurality of memory cells connected to said word line in a spaced apart manner;

a plurality of pairs of data lines connected to said memory cells to transfer data to and from said memory cells in accordance with the column access signal; and positive feedback amplifier means connected to said word line proximate said other end for amplifying the row access signal supplied to said word line and for supplying said amplified row access signal to said word line.

16. A semiconductor memory device according to claim 15 wherein said positive feedback amplifier means is comprised of at least one positive feedback amplifier circuit having first and second power source terminals, first and second MOS transistors of which current paths are connected in series between said first and second power source terminals, said second MOS transistor being connected at the gate to said word line, a third MOS transistor of which the current path is connected between said first power source terminal and said word line and the gate is connected to a junction between said first and second MOS transistor, and resistive means connected between said first power source terminal and the gate of said third MOS transistor.

17. A semiconductor memory device according to claim 16, wherein said first and third MOS transistors are p-channel MOS transistors and said second MOS transistor is an n-channel MOS transistor.

18. A semiconductor memory device according to claim 16 or 17, wherein said positive feedback amplifier circuit further includes a fourth MOS transistor of which the current path is connected between said word line and said second power source terminal.

19. A semiconductor memory device according to claim 18, wherein said resistive means is a fifth MOS transistor which has a current path connected between said first power source terminal and the gate of said third MOS transistor, and a gate connected to said word line.

20. A semiconductor memory device according to claim 16 or 17, wherein said resistive means is a fifth MOS transistor which has a current path connected between said first power source terminal and the gate of said third MOS transistor and a gate connected to said word line.

21. A semiconductor memory device according to claim 15, further comprising a decoder circuit connected to said one end of said word line to selectively supplly said access signal to said word line.

22. A semiconductor memory device according to claim 15 or 21, wherein said positive feedback amplifying means is compled to said other end of said word line.

23. A semiconductor memory device for use with a row decoder supplying a row access signal and a column decoder supplying a column access signal for controlling memory access, the device comprising:

a plurality of memory cells arranged in a matrix of rows and columns; a plurality of word lines, each of the word lines being connected commonly to the memory cells of a different one for the transmission of the row access signal this along from one end to of said rows the other end, the row access being attempted during said transmission;

a plurality of data lines each connected commonly to the memory cells of a different column in said matrix to transfer data to and from the memory cells in said columns in accordance with said column access signal; and positive feedback amplifying means coupled to one end of each of said word lines for amplifying the access signal supplied to said word lines and for supplying said amplified row access signal to said word line whereby the attenuation of said signal level of said row access signals is compensated for by said positive feedback amplifying means.

24. A semiconductor memory device according to claim 23, wherein said positive feedback amplifier means is comprised of at least one positive feedback amplifier circuit having first and second power source terminals, first and second MOS transistors of which the current paths are connected in series between said first and second power source terminals, said second MOS transistor being connected at the gate to said word line, a third MOS transistor of which the current path is connected between said first power source terminal and said word line and the gate is connected to a junction between said first and second MOS transistors, and resistive means connected between said first power source terminal and the gate of said third MOS transistor.

25. A semiconductor memory device according to claim 24, wherein said first and third MOS transistors are p-channel MOS transistors and said second MOS transistor is an n-channel MOS transistor.

26. A semiconductor memory device according to claim 24, wherein said positive feedback amplifier circuit further includes a fourth MOS transistor of which the current path is connected between said word line and said second power source terminal.

27. A semiconductor memory device according to claim 26, wherein said resistive means is a fifth MOS transistor which has a current path connected between said first power source terminal and the gate of said third MOS transistor, and a gate connected to said word line.

28. A semiconductor memory device according to claim 23 or 24, wherein said resistive means is a fifth MOS transistor which has a current path between said first power source terminal and the gate of said third MOS transistor and a gate connected to said word line.

29. A semiconductor memory device according to claim 23 further comprising a decoder circuit connected to said one end of said word lines for selectively supplying the row access signal to said word lines.

30. A semiconductor memory device according to claim 23 or 29, wherein said positive feedback amplifying means is coupled to said other end of said word line.

31. A semiconductor memory device for use with a row decoder supplying row access signals and a column decoder supplying column access signals, the device comprising:

at least one word line for receiving the row access signal at one end and for transmitting the received row access signal there along, the level of the row access signal being attenuated during transmission from said one end of said word line;

a plurality of memory cells connected to said word lines;

plural pairs of data lines connected to said memory cells for transferring data to and from said memory cells in accordance with the column access signals; and positive feedback amplifier means connected to said word line proximate the other end of said word line for amplifying the row access signals supplied to said one end of said word line and for supplying said amplified row access signal to said word line proximate said other end to compensate for the attenuation of said row access signal transmitted along said word line.

32. A semiconductor memory device according to claim 31, wherein said positive feedback amplifier means is comprised of at least one positive feedback amplifier circuit having first and second power source terminals, first and second MOS transistors of which the current paths are connected in series between said first and second power source terminals, said second MOS transistor being connected at the gate to said word line, a third MOS transistor of which the current path is connected between said first power source terminal and said word line and the gate is connected to a junction between said first and second MOS transistors, and resistive means connected between said first power source terminal and the gate of said third MOS transistor.

33. A semiconductor memory device according to claim 32, wherein said first and third MOS transistors are p-channel MOS transistors and said second MOS transistor is an n-channel MOS transistor.

34. A semiconductor memory device according to claim 32 or 33, wherein said positive feedback amplifier circuit further includes a fourth MOS transistor of which the current path is connected between said word line and said second power source terminal.

35. A semiconductor memory device according to claim 34, wherein said resistive means is a fifth MOS transistor which has a current path connected between said first power source terminal and the gate of said third MOS transistor, and at the gate to said word line.

36. A semiconductor memory device according to claim 32 or 33, wherein said resistive means is a fifth MOS transistor which has a current path connected between said first power source terminal and the gate of said third MOS transistor and a gate connected to said word line.

37. A semiconductor memory device according to claim 15, further comprising a decoder circuit connected to said one end of said word line to selectively supplly said access signal to said word line.

38. A semiconductor memory device according to claim 15 or 20, wherein said positive feedback amplifying means is compled to said other end of said word line.

* * * * *

UNITED STATES PATENT AND TRADEMARK OFFICE
CERTIFICATE OF CORRECTION

PATENT NO. : 4,379,346
DATED : April 5, 1983
INVENTOR(S) : KIYOFUMI OCHII ET AL.

It is certified that error appears in the above—identified patent and that said Letters Patent is hereby corrected as shown below:

On the title page
In the Abstract, line 9, change "work" to --word--.

Claim 21, Col. 8, line 48, change "supplly" to --supply--.

Claim 22, Col. 8, line 51, change "compled" to --coupled--.

Claim 37, Col. 10, line 53, change "supplly" to --supply--.

Claim 38, Col. 10, line 56, change "compled" to --coupled--.

Signed and Sealed this

Sixteenth Day of August 1983

[SEAL]

Attest:

GERALD J. MOSSINGHOFF

Attesting Officer   Commissioner of Patents and Trademarks